United States Patent
Kim et al.

(10) Patent No.: US 10,664,195 B2
(45) Date of Patent: May 26, 2020

(54) MEMORY DEVICES AND METHODS FOR CONTROLLING THE SAME

(71) Applicant: Samsung Electronics Co., Ltd., Suwon-si, Gyeonggi-do (KR)

(72) Inventors: Hye Ju Kim, Namhae-gun (KR); Hyo Bong Son, Hwaseong-si (KR); Ml-Hyang Lee, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 31 days.

(21) Appl. No.: 15/992,230

(22) Filed: May 30, 2018

(65) Prior Publication Data
US 2019/0121579 A1   Apr. 25, 2019

(30) Foreign Application Priority Data
Oct. 25, 2017 (KR) .................. 10-2017-0139414

(51) Int. Cl.
| | | |
|---|---|---|
| *G06F 12/00* | (2006.01) | |
| *G06F 3/06* | (2006.01) | |
| *G11C 11/56* | (2006.01) | |
| *G11C 16/04* | (2006.01) | |
| *H01L 27/11582* | (2017.01) | |

(52) U.S. Cl.
CPC .......... *G06F 3/0659* (2013.01); *G06F 3/0604* (2013.01); *G06F 3/0623* (2013.01); *G06F 3/0652* (2013.01); *G06F 3/0679* (2013.01); *G11C 11/5642* (2013.01); *G11C 11/5671* (2013.01); *G11C 16/0483* (2013.01); *H01L 27/11582* (2013.01)

(58) Field of Classification Search
CPC .... G06F 3/0659; G06F 3/0604; G06F 3/0623; G06F 3/0652; G06F 3/0679; G11C 16/08; G11C 16/26; G11C 16/0483; G11C 16/10; G11C 11/5642; G11C 11/5671; G11C 7/106; G11C 8/14; G11C 2211/563; G11C 29/52; G11C 8/10; H01L 27/11582; H01L 27/1157; H01L 27/11556
See application file for complete search history.

(56) References Cited

U.S. PATENT DOCUMENTS 5,353,256 A * 10/1994 Fandrich ............. G06F 12/1425
                                                              365/185.11
6,154,808 A    11/2000 Nagase et al.
(Continued)

FOREIGN PATENT DOCUMENTS

| JP | 2010 108315 | 5/2010 |
| JP | 2015 053075 | 3/2015 |
| JP | 2017117099 | 6/2017 |

*Primary Examiner* — David Yi
*Assistant Examiner* — Tahilba O Puche
(74) *Attorney, Agent, or Firm* — Myers Bigel, P.A.

(57) ABSTRACT

A memory device, as provided herein, may include an invalidation bit circuit and a cell array. In methods for controlling such memory devices, the invalidation bit circuit may receive an invalid control command from a memory controller to update the invalid bit data to one of first and second states different from each other, the invalidation bit circuit may receive a read control command from the memory controller and may provide an invalid signal when the invalid bit data is in the first state, the invalidation bit circuit may transmit a data request when the invalid bit data is in the second state, and the cell array may receive the data request and provide data.

18 Claims, 7 Drawing Sheets

(56) References Cited

U.S. PATENT DOCUMENTS

| | | | |
|---|---|---|---|
| 7,826,280 B2* | 11/2010 | Goetz | G11C 7/02 |
| | | | 365/189.05 |
| 9,367,444 B2 | 6/2016 | Hashimoto | |
| 9,658,780 B2* | 5/2017 | Nemazie | G06F 3/061 |
| 9,666,286 B2* | 5/2017 | Lee | G11C 16/24 |
| 9,696,907 B2 | 7/2017 | Shu et al. | |
| 2016/0259583 A1 | 9/2016 | Kasa et al. | |
| 2016/0299715 A1 | 10/2016 | Hashimoto et al. | |
| 2017/0115890 A1 | 4/2017 | Devendrappa et al. | |
| 2018/0032541 A1* | 2/2018 | Park | G06F 21/6209 |

\* cited by examiner

MEMORY DEVICES AND METHODS FOR CONTROLLING THE SAME

CROSS-REFERENCE TO RELATED APPLICATION

This application claims priority under 35 U.S.C. § 119 from Korean Patent Application No. 10-2017-0139414 filed on 25 Oct. 2017, in the Korean Intellectual Property Office the entire contents of which are herein incorporated by reference for all purposes.

BACKGROUND

1. Technical Field

The present disclosure relates to memory devices and methods for controlling the same.

2. Description of the Related Art

In systems that utilize a nonvolatile memory, overwriting may be impracticable or impossible, and a large overhead may occur when writing new data, while preserving valid data of the block.

In order to overcome these structural limitations, for some systems, in a write operation, a method for writing data at a new position and managing the mapping between the logical address and the physical address is used to improve the performance.

For example, when a data deletion command is received, instead of deleting the actual data with respect to the data deletion command, only the mapping data is deleted. The actual data may remain as it is at the physical address. When such a deletion is repeated, various versions of data of the same logical address may be present on the nonvolatile memory device, for example at different physical addresses.

If anyone attempts to access the erased data through an abnormal route, for example with a malicious purpose, there may be no way to prevent access to the actual data stored at the one or more different physical addresses. Some systems provide secure file erase commands, which prevent access through erasure of the remaining old data of the erased file in cooperation with the host application.

In order to find and delete old data at the time of operation of secure file erase, after checking the mapping of the logical address with respect to the physical address of the whole region, the process of separately carrying the valid data needs to be performed. This acts as overhead of the memory device.

SUMMARY

Aspects of the present disclosure may provide memory devices capable of blocking accesses to old data.

Aspects of the present disclosure provide methods for controlling memory devices that are capable of blocking accesses to old data.

However, aspects of the present disclosure are not limited to those set forth herein. The above and other aspects of the present disclosure will become more apparent to one of ordinary skill in the art to which the present disclosure pertains by referencing the detailed description of the present inventive concepts, given below.

According to an aspect of the present inventive concepts, there may be provided a memory device. The memory device may comprise an invalidation bit circuit and a cell array. The invalidation bit circuit may be configured to receive an invalid control command from a memory controller and may be configured to update invalid bit data to one of first and second states different from each other The invalidation bit circuit may be configured to receive a read control command from the memory controller and may be configured to provide an invalid signal when the invalid bit data is in the first state, and the invalidation bit circuit may be configured to transmit a data request to the cell array when the invalid bit data is in the second state. The cell array may be configured to receive the data request and provide data.

According to another aspect of the present inventive concepts, there may be provided a memory device comprising a memory controller which is configured to receive a first command and address signal from a host, an address decoder which receives a second address signal from the memory controller, a word line and a string selection line connected to the address decoder, an invalidation bit circuit which is connected to the word line and the string selection line and configured to receive a control command from the memory controller, the invalidation bit circuit further configured to update an invalid data bit in accordance with the control command and block a read operation of data in accordance with the invalid data bit and a cell array which is connected to the word line and the string selection line, and stores the data.

According to still another aspect of the present inventive concepts, there is provided a memory device comprising a processing core, a volatile memory, a memory module and a bus which connects the processing core, the volatile memory, the memory module, and the host, wherein the memory module includes a memory controller which receives a command from the host, and an invalidation bit circuit which receives a control command from the memory controller, updates an invalid data bit in accordance with the control command, and blocks the command of the host in accordance with the invalid data bit.

According to an aspect of the present inventive concepts, there is provided a method for controlling a memory device, the method comprising receiving a secure file erase command from a host, updating an invalid data bit to one of first and second states different from each other, receiving a read command from the host, checking the invalid data bit and providing an invalid signal when the invalid data bit is in the first state, and providing data when the invalid data bit is in the second state different from the first state.

BRIEF DESCRIPTION OF THE DRAWINGS

The above and other aspects and features of the present disclosure will become more apparent by describing in detail example embodiments of the provided inventive concepts with reference to the attached drawings, in which.

DETAILED DESCRIPTION

Figure 1:
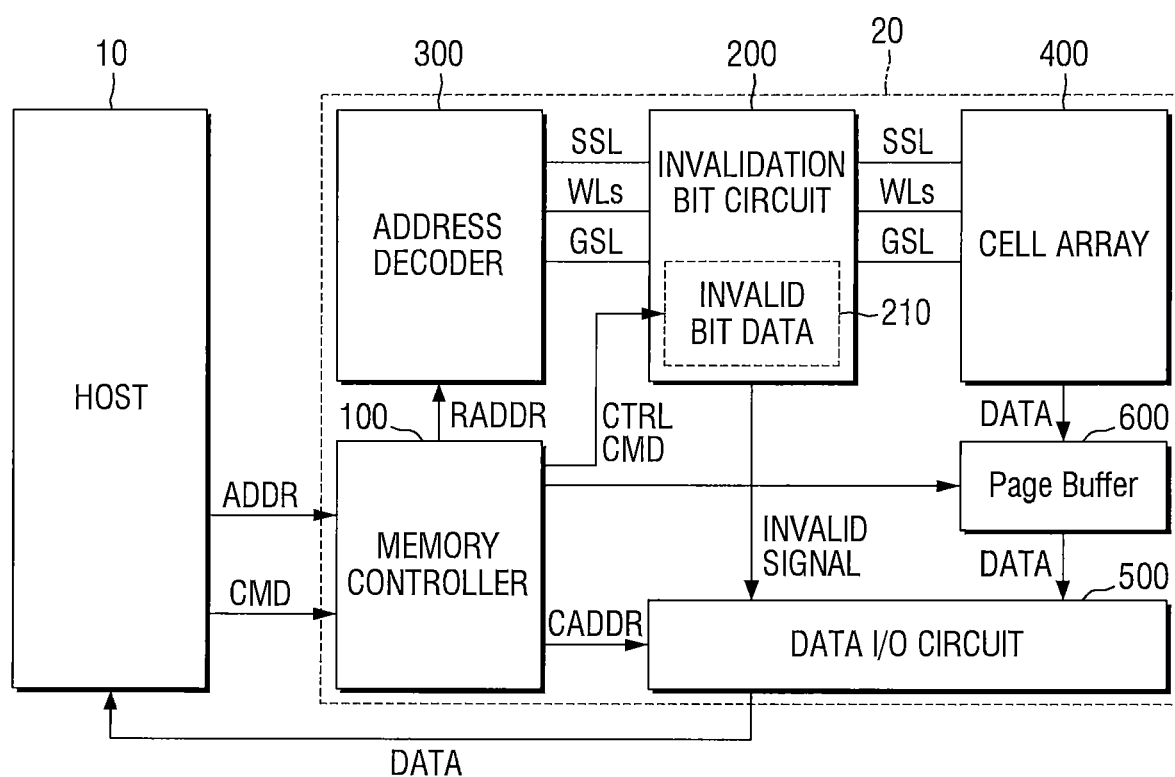
FIG. 1 is a block diagram illustrating a memory device according to some embodiments of the present inventive concepts.

Advantages and features of the present inventive concepts and methods of accomplishing the same may be understood more readily by reference to the following detailed description of preferred embodiments and the accompanying drawings. The present inventive concepts may, however, be embodied in many different forms and should not be construed as being limited to the embodiments set forth herein. Rather, these embodiments are provided so that this disclosure will be thorough and complete and will fully convey the inventive concepts to those skilled in the art, and the scope of the present application is defined by the appended claims. In the drawings, thicknesses of layers and regions may be exaggerated for clarity.

Hereinafter, a memory device according to some embodiments of the present inventive concepts will be described with reference to FIGS. 1 to 3.

Figure 2:
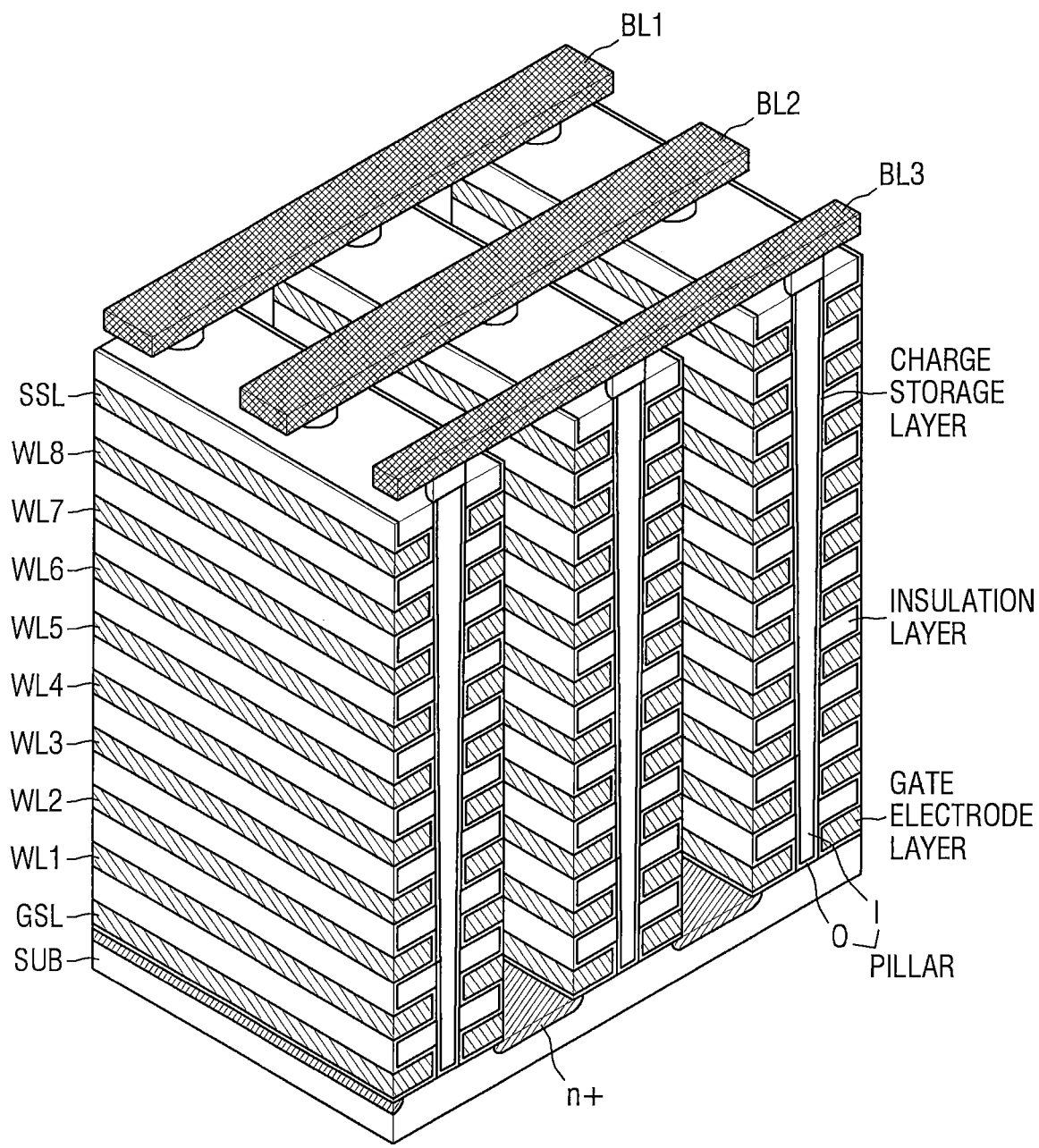
FIG. 2 is a perspective view exemplarily illustrating an embodiment in which the cell array of FIG. 1 is three-dimensionally provided.

FIG. 1 is a block diagram illustrating the memory device according to some embodiments of the present inventive concepts, and FIG. 2 is a perspective view illustrating an embodiment in which a cell array of FIG. 1 is three-dimensionally provided. FIG. 3 is an equivalent circuit diagram of the cell array of FIG. 2.

Referring to FIG. 1, a first memory device 20 may be connected to a host 10. The host 10 may control a data processing operation (e.g., a read operation, a write operation, a secure file erase operation) of the first memory device 20.

According to the embodiments, the host 10 may be provided as, but is not limited to, a host processor, an integrated circuit (IC), a mother board, a system on chip (SoC), an application processor (AP), a mobile AP, a web server, a data server, or a database server.

The first memory device 20 according to some embodiments of the present inventive concepts may include a memory controller 100, an address decoder 300, an invalidation bit circuit 200, a cell array 400, a page buffer 600, and a data I/O circuit 500.

The memory controller 100 may receive a command (CMD) and an address signal (ADDR) from the host 10. The memory controller 100 may generate a row address signal (RADDR) and a column address signal (CADDR) on the basis of the command (CMD) and the address signal (ADDR), and may operate a memory cell array included in the cell array 400, on the basis of the row address signal (RADDR) and the column address signal (CADDR).

Specifically, the memory controller 100 may transfer the row address signal (RADDR) to the address decoder 300 and may transfer the column address signal (CADDR) to the data I/O circuit 500.

Further, the memory controller 100 may generate a control command (CTRL CMD) on the basis of the command (CMD). The memory controller 100 may transmit the control command (CTRL CMD) to the invalidation bit circuit 200.

As examples, the command (CMD) received from the host by the memory controller 100 may be one of a read command, a write command, and/or a secure file erase command.

The read command may be a command which reads the data (DATA) stored in the logical address designated in the cell array 400, and the write command may be a command which writes data (DATA) on the logical address designated in the cell array 400.

The secure file erase command may be a command which deletes the data (DATA) stored in the logical address designated in the cell array 400.

The address decoder 300 may receive the row address signal (RADDR) from the memory controller 100. The address decoder 300 may selectively decode the row address signal (RADDR) to selectively apply the voltage corresponding to the command (CMD) to the string selection line (SSL), the word lines (WLs), and the ground selection line (GSL). That is, the address decoder 300 may determine whether to apply a voltage to one of the lines of all of the string selection line (SSL), the word lines (WLs), and the ground selection line (GSL) in the row address signal (RADDR).

The string selection line (SSL), the word lines (WLs) and the ground selection line (GSL) may be shared by the address decoder 300, the invalidation bit circuit 200, and the cell array 400. That is, the address decoder 300, the invalidation bit circuit 200, and the cell array 400 may be connected for each of the string selection line (SSL), the word lines (WLs) and the ground selection line (GSL).

The cell array 400 may include a plurality of memory cells therein, and data bits may be stored in each memory cell. Each of the memory cells may be one of a single level cell (SLC) which stores a single data bit, a multi-level cell (MLC) which stores two bit data, and a triple level cell (TLC) which stores three bit data. However, the present disclosure is not limited thereto.

In response to the column address signal (CADDR), the data I/O circuit 500 receives the data (DATA) from the memory cells connected to one of the word lines (WLs) through a plurality of bit lines (e.g., BL1 to BL3 of FIG. 2).

In some embodiments of the present inventive concepts, the cell array 400 may be provided as a two-dimensional structure or a three-dimensional structure. An embodiment in which the cell array 400 is three-dimensionally provided will be described later with reference to FIGS. 2 and 3.

Referring to FIG. 2, the cell array 400 is formed in a direction perpendicular to the substrate (SUB). An n+ doping region is formed on the substrate (SUB). A gate electrode layer and an insulation layer may be alternately deposited on the substrate (SUB). Further, a charge storage layer may be formed between the gate electrode layer and the insulation layer When vertically patterning the gate electrode layer and the insulation layer vertical, a V-shaped pillar is formed. The pillar may penetrate the gate electrode layers and the insulation layers and may be connected to the substrate (SUB). An outer portion O of the pillar may be made of a channel semiconductor, and an inner portion I may be made of an insulating material such as silicon oxide.

The gate electrode layers may be connected to the ground selection line (GSL), a plurality of word lines (WL1 to WL8), and the string selection line (SSL). The pillar may be connected to a plurality of bit lines (BL1 to BL3).

In FIG. 2, the cell array 400 is illustrated to include the ground selection line (GSL), the string selection line (SSL), the eight word lines (WL1, WL2, . . . , WL8) and the three bit lines (BL1, BL2, and BL3), but the number of the lines may be larger or smaller than this example.

Figure 3:
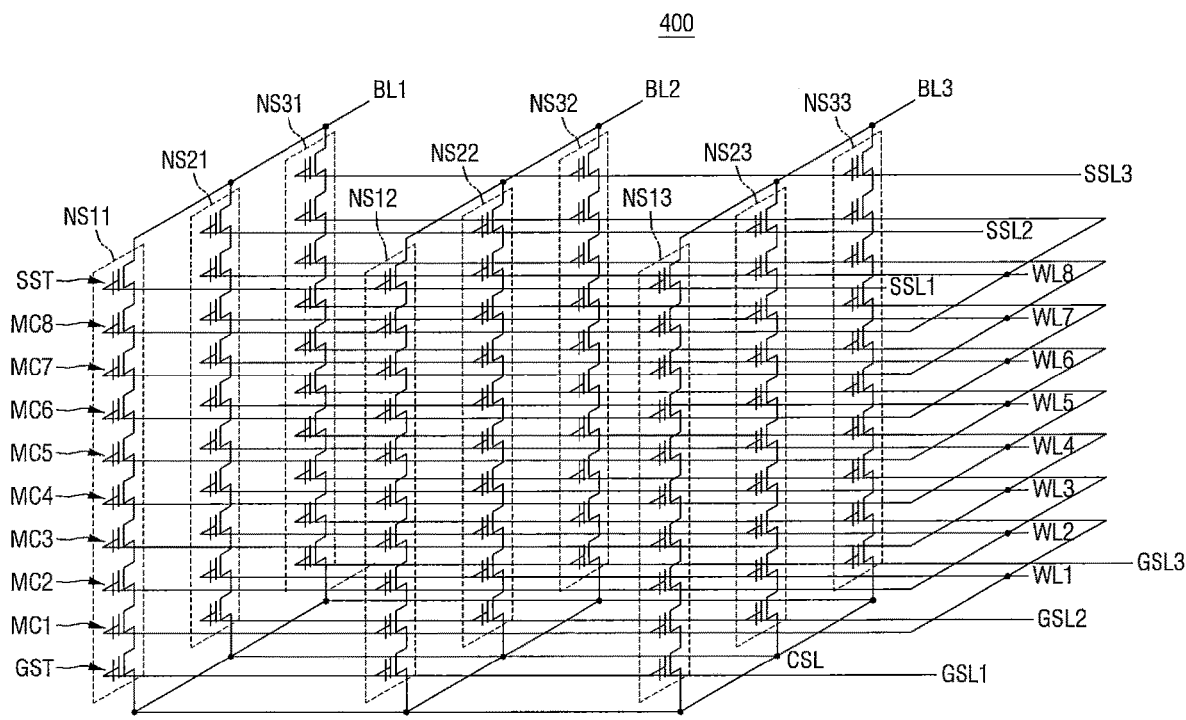
FIG. 3 is an equivalent circuit diagram of the cell array of FIG. 2.

Referring to FIG. 3, in the cell array 400, cell strings (NS11 to NS33) are connected between the bit lines (BL1, BL2, and BL3) and a common source line (CSL). Each of the cell strings (e.g., NS11) includes a string selection transistor (SST), a plurality of memory cells (MC1, MC2, . . . , MC8), and a ground selection transistor (GST).

The string selection transistor (SST) is connected to the string selection lines (SSL1, SSL2, and SSL3). The plurality of memory cells (MC1, MC2, . . . , MC8) are connected to corresponding word lines (WL1, WL2, . . . , WL8), respectively. The ground selection transistor (GST) is connected to the ground selection lines (GSL1, GSL2, and GSL3). The string selection transistor (SST) is connected to the bit line (BL), and the ground selection transistor (GST) is connected to the common source line (CSL).

The string selection transistor (SST) is connected to the string selection lines (SSL1, SSL2, and SSL3). The plurality of memory cells (MC1, MC2, . . . , MC8) are connected to the corresponding word lines (WL1, WL2, . . . , WL8), respectively. The ground selection transistor (GST) is connected to the ground selection lines (GSL1, GSL2, and GSL3). The string selection transistor (SST) is connected to the bit line (BL), and the ground selection transistor (GST) is connected to the common source line (CSL).

Referring again to FIG. 1, the cell array 400 may include a plurality of memory cells therein, and the data bits may be stored in each memory cell. Each of the memory cells may be one of a single level cell (SLC) storing a single data bit, a multi-level cell (MLC) storing two bit data, and a triple level cell TLC storing three bit data.

In response to the column address signal (CADDR), the data I/O circuit 500 may receive the data from the memory cells in the cell array 400 connected to one of the word lines (WLs) through the plurality of bit lines (BL1 to BL3 of FIG. 2).

The page buffer 600 may temporarily store data (DATA) between the cell array 400 and the data I/O circuit 500. That is, the page buffer 600 may receive the data (DATA) from the cell array 400. The page buffer 600 may continuously store the data (DATA) until it receives the read signal from the memory controller 100. When receiving the read signal from the memory controller 100, the page buffer 600 may transmit the data (DATA) to the data I/O circuit 500.

The page buffer 600 may be connected to the cell array 400 via a bit line. The page buffer 600 may temporarily store data to be programmed in the selected page or data that is read from the selected page.

The page buffer 600 may include a plurality of latches. For example, the page buffer 600 may include a cache latch, an LSB latch, a CSB latch, a MSB latch, and a sense latch. The cache latch may temporarily store data (DATA) when the data (DATA) is input to the cell array 400 or is output from the cell array 400. The sense latch may detect the data (DATA) of the memory cell at the time of the read operation. The LSB latch may store the LSB data at the time of the write operation. The MSB data may be stored at the time of the write operation in the case of the MSB latch. The CSB data may be stored at the time of the write operation in the case of the CSB latch. The LSB latch, the CSB latch, and the MSB latch corresponding to the respective data are target latches, respectively.

The data I/O circuit 500 may be internally connected to the page buffer 600 via a data line, and may be externally connected to the memory controller 100 via an I/O line. The data I/O circuit 500 may receive the data (DATA) from the memory controller 100 at the time of the write operation and may transmit the data to the page buffer 600. Further, the data I/O circuit 500 may provide data (DATA), which may be provided from the page buffer 600 at the time of read operation, to the memory controller 100.

Since the erase command of the existing memory device may delete the data (DATA) in a logical address, the mapping data of the logical address and the physical address was deleted, without deleting the data (DATA) in the physical address. That is, although the data (DATA) may seem to be deleted in the logical address designated at the level of the host 10, the data (DATA) may actually still exist in the physical address of the cell array 400.

Such a method has been used since the cell array 400 has characteristics of nonvolatile memory. That is, since the nonvolatile memory can delete data in units of blocks rather than file units, it may take a relatively long period of time to selectively delete the data existing in physical addresses. Therefore, in existing memory devices, a method is used in which deletion of actual data is suspended under the premise that the storage space is sufficient inside the cell array 400. In such a method, the mapping data of the logical address and the physical address is deleted to speed up the operation speed of the memory device, and then, the remaining old data is selectively deleted during an idle period later.

Alternatively, it is also possible to use a method for deleting all the remaining old data using the secure file erase, but very large overhead may occur in such a method in the process of searching and deleting the entire old data and gathering the valid data together.

The first memory device 20 according to some embodiments of the present inventive concepts may enable the rapid secure file erase in units of files, using the invalidation bit circuit 200.

The invalidation bit circuit 200 may receive a control command (CTRL CMD) from the memory controller 100. The control command (CTRL CMD) may vary depending on the command (CMD) received from the host 10 by the memory controller 100.

Specifically, when receiving the secure file erase command or the write command, the memory controller 100 may generate and transmit an invalid control command to the invalidation bit circuit 200.

The above-mentioned invalid control command may include an invalid data set command and an invalid data clean command. When receiving the secure file erase command, the memory controller 100 may transmit the above-described invalid data set command to the invalidation bit circuit 200, and when receiving the write command, the memory controller 100 may transmit the invalid data clean command to the invalidation bit circuit 200.

When receiving the read command, the memory controller 100 may generate and transmit the read control command to the invalidation bit circuit 200.

The invalidation bit circuit 200 may include invalid bit data 210 therein. Specifically, the invalid bit data 210 may exist for each of the string selection lines (SSL) and for each of the word lines (WLs), respectively. The invalid bit data 210 may store as to whether or not the internal data of each of the string selection lines (SSL) and the respective word lines (WLs) are invalid.

Specifically, the invalid bit data 210 may include which memory cell data is invalid. Here, the term "invalid" refers to a state in which data read needs to be blocked. That is, the invalid bit data 210 may be marking for blocking an access to the old data in order to prevent the remaining old data from leaking out.

If the data (DATA) corresponding to a specific address information is invalid, this case may be expressed as a first state, and if the data (DATA) is valid, this case may be expressed as a second state. The invalid bit data 210 may be in a table format. That is, it may be expressed as the first state or the second state to correspond to the physical address information.

At this time, the first state and the second state may be expressed by a single bit of "1" or "0". Of course, it is also possible to express the first and second states in reverse. Since the aforementioned single bit expression is only an example, memory devices according to some embodiments of the present inventive concepts are not limited thereto.

Upon receiving the invalid data set command from the memory controller 100, the invalidation bit circuit 200 may update the invalid bit data 210 for the corresponding physical address to the first state.

Conversely, when the invalidation bit circuit 200 receives the invalid data clean command from the memory controller 100, the invalidation bit circuit 200 may update the invalid bit data 210 for the corresponding physical address to the second state.

That is, when the secure file erase command is received from the host 10, the invalid bit data 210 may be updated to the first state, and when the write command is received, the invalid bit data 210 may be updated to the second state.

When the invalidation bit circuit 200 receives the read control command from the memory controller 100, the invalidation bit circuit 200 may determine whether the data (DATA) serving as a target of the read operation is invalid, using the invalid bit data 210. Specifically, when the invalid bit data 210 is in the first state, the data (DATA) may be invalid, and when the invalid bit data 210 is in the second state, the data (DATA) may not be invalid.

The invalidation bit circuit 200 may transmit the invalid signal (INVALID SIGNAL) to the data I/O circuit 500, when the data (DATA) is invalid, that is, when the invalid bit data 210 is in the first state. That is, it may mean that the read operation is substantially blocked by making a reply of impossibility to the read request of the host 10. At the same time, the data (DATA) in the cell array 400 may not be transmitted to the page buffer 600.

The invalid signal (INVALID SIGNAL) may have the form of a clean signal (CLEAN SIGNAL) or uncorrect signal (UNCORRECT SIGNAL). That is, the clean signal makes a reply of non-data to the read request of the host 10, and the uncorrect signal makes a reply of an incorrect read request. Both the clean signal and the uncorrect signal may mean substantially blocking of the read operation.

The invalidation bit circuit 200 may perform a general read operation when the data (DATA) is not invalid, that is, when the invalid bit data 210 is in the second state. That is, the data (DATA) in the cell array 400 may be moved to the page buffer 600.

Subsequently, in accordance with the read signal from the memory controller 100, the data (DATA) may be transmitted to the data I/O circuit 500. In accordance with the column address signal (CADDR) of the memory controller 100, the data I/O circuit 500 may transmit the data (DATA) to the host 10.

The first memory device 20 according to some embodiments of the present inventive concepts may improve the security performance of old data. That is, in the existing device, there may be a possibility that only the mapping data is deleted, and the old data which is not actually deleted may flow out to the outside through the abnormal route. That is, there may be a case where a direct access is made to a physical address before data stored at that address is completely deleted during the idle period, or a case where the old data is restored by a logical address. Also, when executing the secure erase operation to prevent this, it may not be possible to perform deletion in the units of file, and the overhead of the device may be large.

However, since the first memory device 20 according to some embodiments of the present inventive concepts prevents the deleted data from being read to the outside via the invalid marking, security can be maintained for the unintended access.

Since the old data may not be read to the outside before being deleted later, it is possible to prevent the outflow to the outside even when there is an access with malicious intent. Further, since the invalidation bit circuit 200 is added in terms of hardware, even if the command (CMD) is not provided at the level of the host 10 (for example, trim (TRIM) command), the invalid operation of data may be voluntarily executed at the level of the memory controller 100.

Hereinafter, referring to FIG. 4, a memory system 50 including the first memory device 20 according to some embodiments of the present inventive concepts will be described. The repeated parts of the above explanation will be omitted or simplified.

Figure 4:
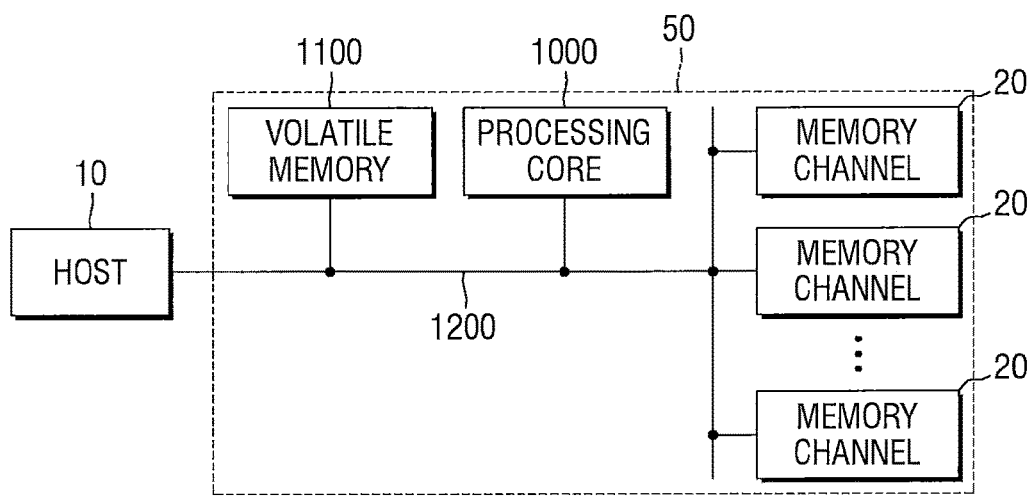
FIG. 4 is a block diagram illustrating a memory system to which the memory device of FIG. 1 is applied.

FIG. 4 is a block diagram illustrating a memory system to which the memory device of FIG. 1 is applied.

Referring to FIG. 4, the host 10 may be connected to the memory system 50 to control the data processing of the memory system 50.

The memory system 50 may include a processing core 1000, a volatile memory 1100, a plurality of memory channels 20, and a system bus 1200.

The memory system 50 may send and receive commands and/or data to and from the host 10. The memory system 50 may be provided as a flash-based storage, but is not limited thereto. For example, the memory system 50 may be provided as a solid-state drive or solid-state disk (SSD) or an embedded SSD (eSSD), but is not limited thereto.

The host 10 and the memory system 50 may be connected to each other to provide a single data processing system. The data processing system may be provided as, for example, a PC (personal computer), a workstation, a data center, an internet data center (IDC), a direct attached storage (DAS) system, a storage area network (SAN) system, a NAS (network attached storage) system, an RAID (redundant array of inexpensive disks or redundant array of independent disks) system, or a mobile device, but is not limited thereto.

Further, the mobile device may be provided as, but is not limited to, a laptop computer, a mobile phone, a smart phone, a tablet PC, a personal digital assistant (PDA), an enterprise digital assistant (EDA), a digital still camera, a digital video camera, a portable multimedia player (PMP), a personal navigation device or a portable navigation device (PND), a handheld game console, a mobile internet device (MID), a wearable computer, internet of things (IoT) devices, internet of everything (IoE) devices, or drone.

According to the embodiments, the transmission path of command and/or data between the host 10 and the memory system 50 may be provided as, but is not limited to, a serial advanced technology attachment (SATA) interface, a SATAe (SATA express) interface, a SAS (serial attached small computer system interface (SCSI)) interface, a PCIe (peripheral component interconnect express) interface, a NVMe (non-volatile memory express) interface, an AHCI (advanced host controller interface) interface or a MMC (multimedia card) interface.

According to the embodiments, the transmission path of commands and/or data between the host 10 and the memory system 50 may transmit electrical signals or optical signals.

The processing core 1000 may perform the operation of the memory system 50 within the memory system 50. Specifically, the processing core 1000 may perform the work of the data processing command transmitted by the host 10, the refresh work of the nonvolatile memory and the like.

In FIG. 4, one processing core 1000 is illustrated, but the present disclosure is not limited thereto. That is, a plurality of processing cores 1000 of the memory device according to some embodiments of the present inventive concepts may exist.

The volatile memory 1100 may execute the work of the data processing command and the refresh work of the memory channel 20 together with the processing core 1000. The volatile memory 1100 may be, for example, a DRAM (dynamic random access memory). The volatile memory 1100 may perform the role of buffer memory to perform the above works.

The memory channel 20 may be the aforementioned first memory device 20. The first memory device 20 may be, for example, a flash memory, including a NAND flash memory. A plurality of first memory devices 20 may be provided. Since the memory channels of FIG. 4 are merely illustrative, the memory system 50 including the first memory device 20 according to some embodiments of the present inventive concepts may have four or less channels, or five or more channels.

The system bus 1200 may connect the host 10, the volatile memory 1100, the processing core 1000, and the memory channel 20 to one another. That is, movement of both data and request may be made via the system bus 1200.

Hereinafter, referring to FIG. 5, a second memory device 21 according to some embodiments of the present inventive concepts will be described. The repeated parts of the above explanation will be omitted or simplified.

Figure 5:
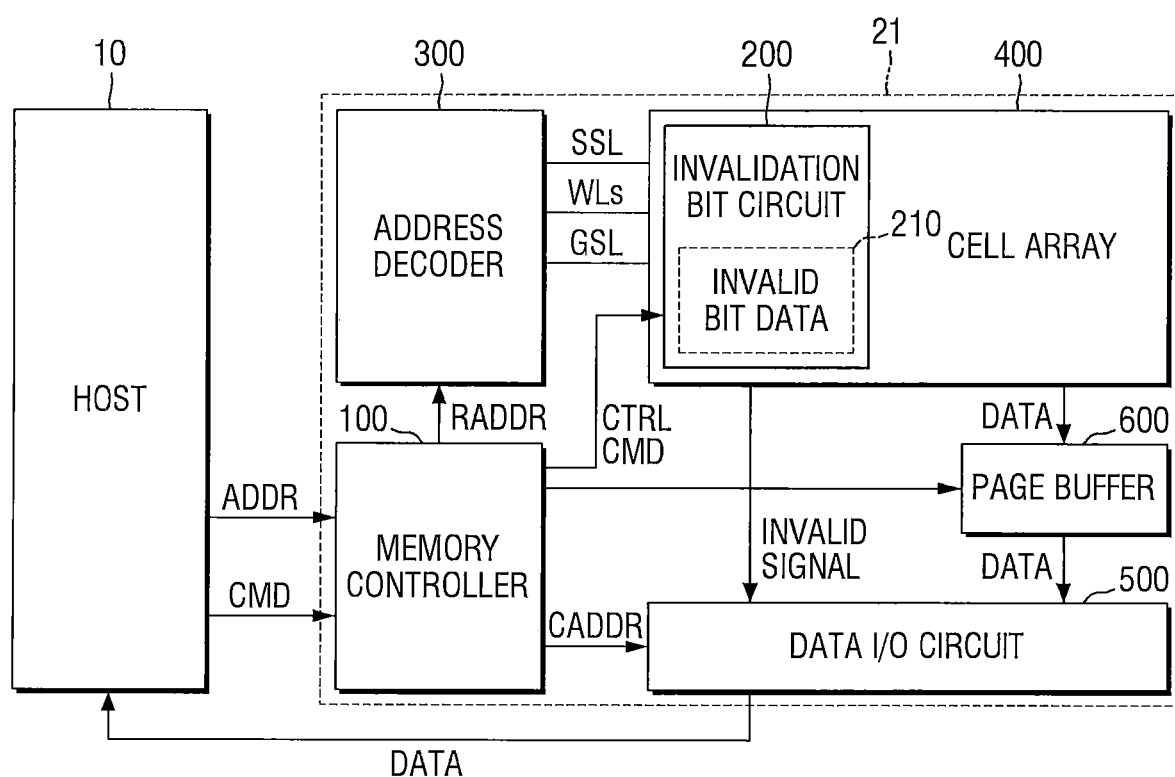
FIG. 5 is a block diagram illustrating the memory device according to some embodiments of the present inventive concepts.

FIG. 5 is a block diagram illustrating the memory device according to some embodiments of the present inventive concepts.

Referring to FIG. 5, the invalidation bit circuit 200 of the second memory device 21 according to some embodiments of the present inventive concepts may be located inside the cell array 400.

Therefore, the invalidation bit circuit 200 may determine whether the data is invalid for each of the string selection line (SSL) and the word lines (WLs) inside the cell array 400.

The invalidation bit circuit 200 may transmit the signal to another data line inside the cell array 400. In accordance with the above signal, an access to the string selection line (SSL), the word lines (WLs) and the ground selection line (GSL) connected to the cell array 400 may be selectively blocked.

However, the present disclosure is not limited thereto. The invalidation bit circuit 200 and the cell array 400 may share the string selection line (SSL), the word lines (WLs) and the ground selection line (GSL) each other. That is, the invalidation bit circuit 200 may be connected in parallel or in series to the string selection line (SSL), the word lines (WLs) and the ground selection line (GSL) inside the cell array 400. As a result, the string selection line (SSL), the word lines (WLs) and the ground selection line (GSL) connected to the cell array 400 may be selectively blocked.

In the second memory device 21 according to the present embodiment, since the invalidation bit circuit 200 is located inside the cell array 400, it is possible to enhance the degree of integration of the whole device and to minimize transmission using the wiring.

Accordingly, it is possible to provide the second memory device 21 of higher speed.

Hereinafter, a third memory device 22 according to some embodiments of the present inventive concepts will be described referring to FIG. 6. The repeated parts of the above explanation will be omitted or simplified.

Figure 6:
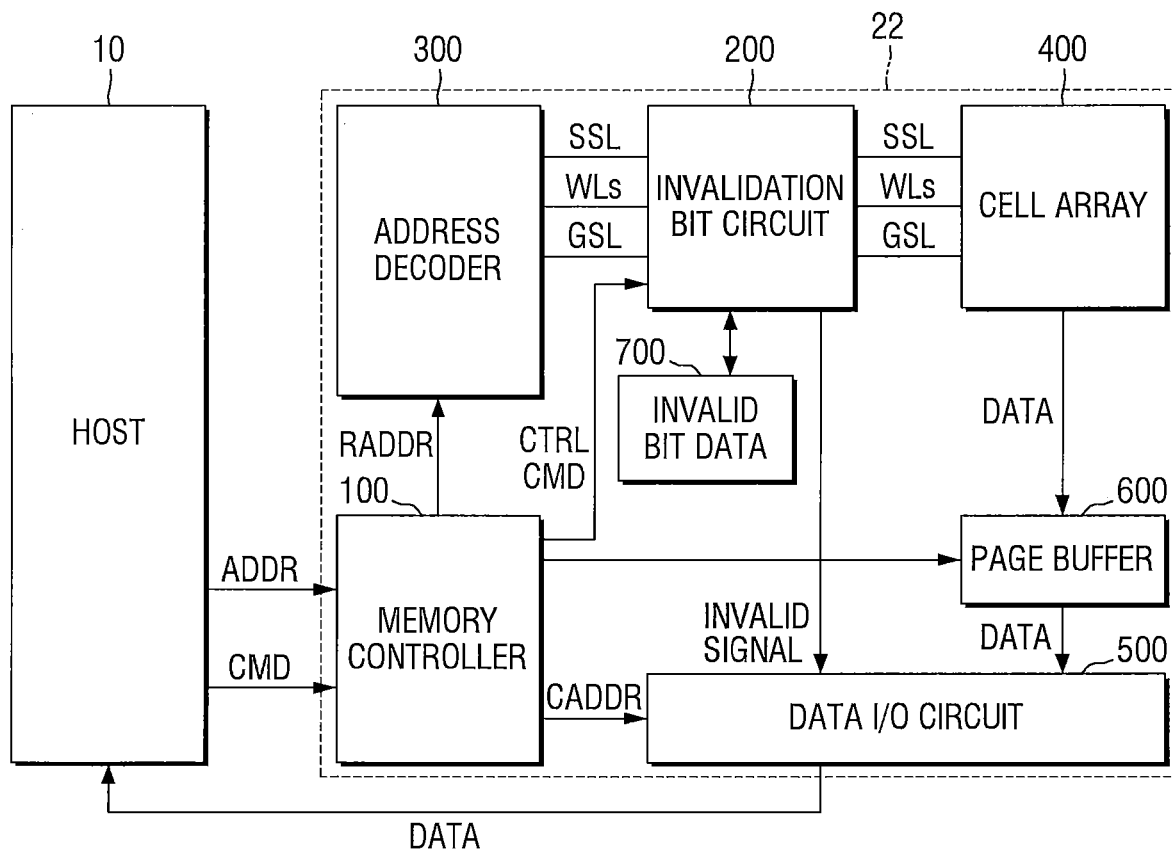
FIG. 6 is a block diagram illustrating the memory device according to some embodiments of the present inventive concepts.

FIG. 6 is a block diagram illustrating the memory device according to some embodiments of the present inventive concepts.

Referring to FIG. 6, an invalid bit data 700 of the third memory device 22 according to some embodiments of the present inventive concepts may be located outside the invalidation bit circuit 200.

The invalidation bit circuit 200 may receive the transmission of then invalid control command or the read control command from the memory controller 100 to update the invalid bit data 700, or may check whether the data (DATA) is invalid through the invalid bit data 700.

Specifically, when the invalidation bit circuit 200 receives the invalid data set command from the memory controller 100 and acquires corresponding address information from the address decoder 300, the state inside the invalid bit data 700 may be updated to the first state.

Conversely, when the invalidation bit circuit 200 receives the invalid data clean command from the memory controller 100 and acquires corresponding address information from the address decoder 300, the state inside the invalid bit data 700 may be updated to the second state.

When the invalidation bit circuit 200 receives the read control command from the memory controller 100 and acquires corresponding address information from the address decoder 300, it may be possible to check whether the corresponding data is in the invalid state by referring to the invalid bit data 700.

At this time, when the invalid bit data 700 corresponding to the data (DATA) is in the first state, that is, when the data (DATA) is in the invalid state, the invalidation bit circuit 200 may transmit the invalid signal (INVALID SIGNAL) to the data I/O circuit 500.

Conversely, when the invalid bit data 700 corresponding to the data (DATA) is in the second state, that is, when the data (DATA) is not in the invalid state, the invalidation bit circuit 200 may allow the read operation to be performed in the cell array 400.

Since the third memory device 22 according to the present embodiment is configured such that the invalidation bit circuit 200 and the invalid bit data 700 separately exist, preservation of the invalid bit data 700 may be further firmly performed. That is, since the string selection line (SSL), the word lines (WLs) and the ground selection line (GSL) are shared by the address decoder 300, the invalidation bit circuit 200, and the cell array 400, there may be high probability of deterioration or damage of data due to the large number of components.

Therefore, the invalid bit data 700 may be separated from the string selection line (SSL), the word lines (WLs) and the ground selection line (GSL), thereby lowering the overall deterioration possibility of the third memory device 22 and enhancing the independence of reliability of the invalid bit data 700.

Further, since the invalid bit data 700 is not added to the string selection line (SSL), the word lines (WLs) and the ground selection line (GSL) to which the signal is actually transmitted, reliability of the signals to be transmitted may also be secured.

Accordingly, the third memory device 22 according to some embodiments of the present inventive concepts may provide the memory device of higher reliability.

The control command (CTRL CMD) is illustrated in FIG. 6 as being transmitted to the invalidation bit circuit 200 from the memory controller 100. However, the control command (CTRL CMD) may also be directly transmitted to the invalid bit data 700. In such a case, the invalid bit data 700 may transmit invalidation of the data (DATA) to the invalidation bit circuit 200.

Hereinafter, methods for controlling memory devices according to some embodiments of the present inventive concepts will be described with reference to FIGS. 1 and 7 through 10. The repeated parts of the above explanation will be omitted or simplified.

Figure 7:
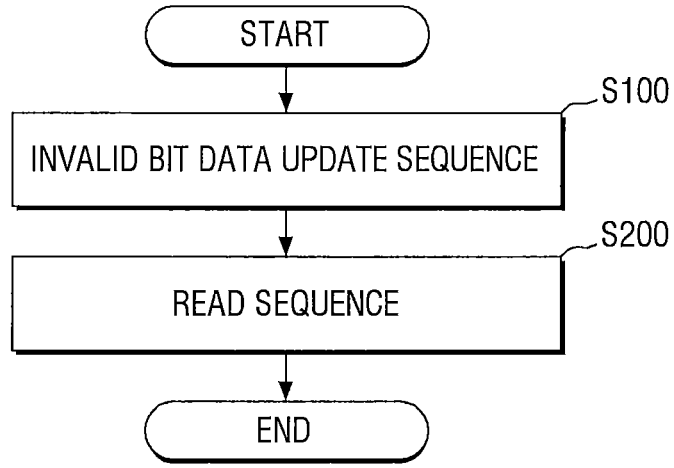
FIG. 7 is a flowchart illustrating a method for controlling the memory device according to some embodiments of the present inventive concepts.
Figure 8:
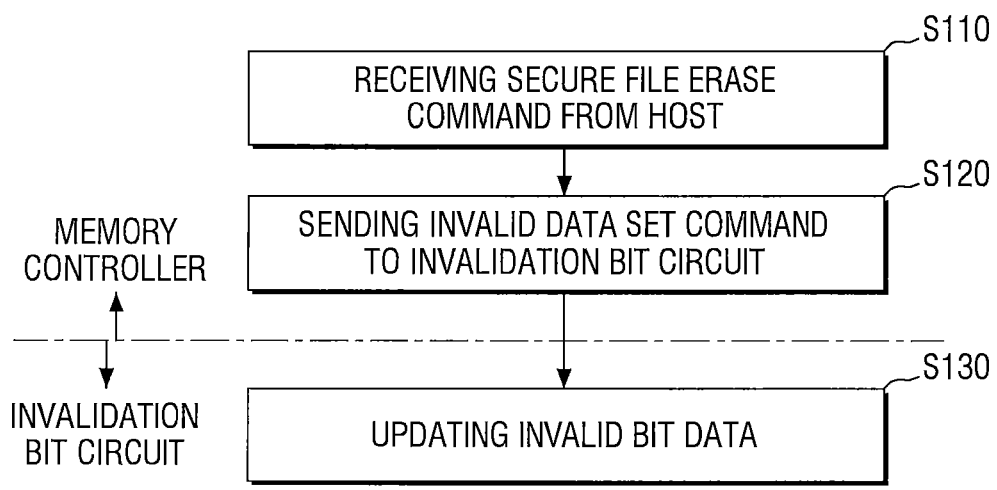
FIG. 8 is a flowchart illustrating the update sequence of the method for controlling the memory device according to some embodiments of FIG. 7 in detail.
Figure 9:
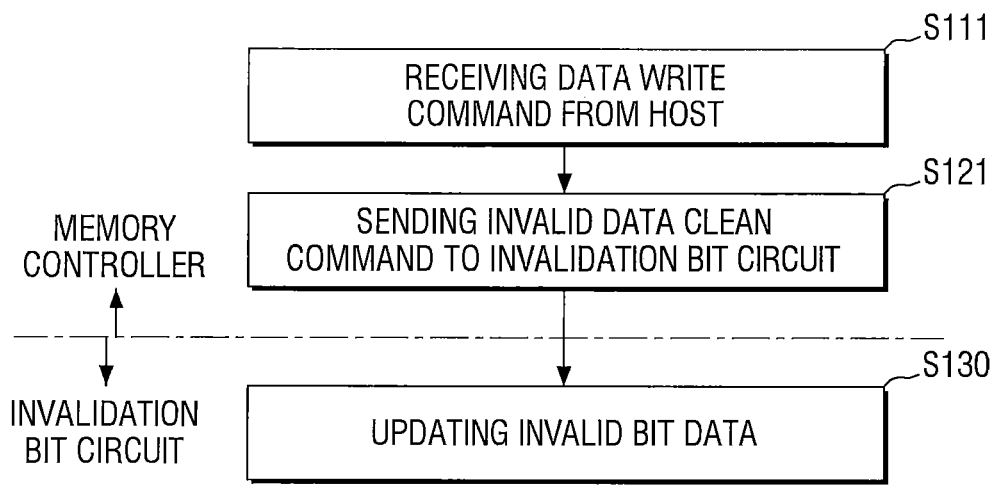
FIG. 9 is a flowchart illustrating the update sequence of the method for controlling the memory device according to some embodiments of FIG. 7 in detail.
Figure 10:
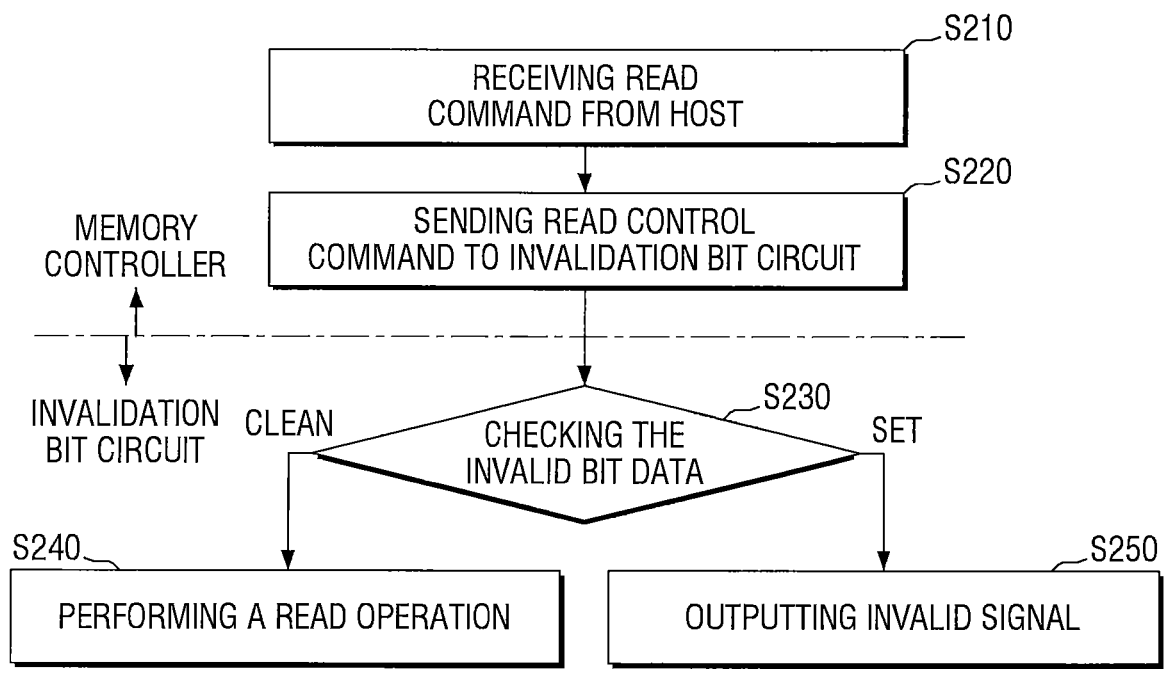
FIG. 10 is a flowchart illustrating the read sequence of the method for controlling the memory device according to some embodiments of FIG. 7 in detail.

FIG. 7 is a flow chart illustrating a method for controlling the memory device according to some embodiments of the present inventive concepts, and FIG. 8 is a flowchart illustrating an update sequence of the method for controlling the memory device according to some embodiments of FIG. 7 in detail. FIG. 9 is a flowchart illustrating the update sequence of the method for controlling the memory device according to some embodiments of FIG. 7 in detail, and FIG. 10 is a flowchart illustrating a read sequence of the method for controlling the memory device according to some embodiments of FIG. 7 in detail.

First, referring to FIG. 7, an update sequence of invalid bit data is executed (S100).

Specifically, referring to FIG. 1, the invalid bit data 210 may store data indicating whether the data located inside the cell array 400 is invalid. The invalid bit data 210 may be updated by the invalid control command of the memory controller 100.

Referring again to FIG. 7, a read sequence is executed (S200).

Specifically, referring to FIG. 1, the invalidation bit circuit 200 may check whether the data (DATA) in the cell array 400 is invalid to determine whether to block or perform the read operation, by referring to the invalid bit data 210.

In FIG. 7, the update sequence (S100) and the read sequence (S200) are illustrated as being executed once, but the methods for controlling the memory devices according to some embodiments of the present inventive concepts are not limited thereto.

That is, in the methods for controlling the memory devices according to some embodiments of the present inventive concepts, the update sequence (S100) may be executed without limitation of the number of times before the read sequence (S200) is performed.

The read sequence (S200) may be executed, using the invalid bit data 210 that is finally updated by the update sequence (S100).

Referring to FIG. 8, detailed steps of the update sequence (S100) of FIG. 7 may be described.

First, a secure file erase command may be received from the host (S110).

Specifically, referring to FIG. 1, the host 10 may transmit the secure file erase command to the memory controller 100. The secure file erase command may be a command which prevents data in the cell array 400 from being externally read for security.

Referring again to FIG. 8, the invalid data set command may be transmitted to the invalidation bit circuit (S120).

Specifically, referring to FIG. 1, the memory controller 100 may transmit the invalid data set command to the invalidation bit circuit 200. The invalid data set command may be a command which updates the invalid bit data 210 to the first state.

Referring again to FIG. 8, the invalid bit data may be updated (S130).

Specifically, referring to FIG. 1, the invalid bit data 210 corresponding to the data (DATA) serving as the target of the secure file erase command is updated to the first state, and the first state may be expressed as a single bit of "1". However, the methods for controlling the memory devices according to some embodiments of the present inventive concepts may be expressed as "0" instead of "1". As long as the first state is expressed differently from the second state, the expression method is not limited at all.

The operations of S110 and S120 of FIG. 8 may be performed by the memory controller 100 of FIG. 1, and the operations of S130 may be performed by the invalidation bit circuit 200 of FIG. 1.

Referring to FIG. 9, the detailed operations of the update sequence (S100) of FIG. 7 may be explained. The update sequence of FIG. 9 may be parallel to the update sequence of FIG. 8 and may be performed independently. That is, the update sequence of FIG. 9 and the update sequence of FIG. 8 are both compatible and not mutually selective. That is, only the update sequence of FIG. 8 may be performed, only the update sequence of FIG. 9 may be performed, and all the update sequences of FIGS. 8 and 9 may be performed.

First, referring to FIG. 9, the write command may be received from the host (S111).

Specifically, referring to FIG. 1, the host 10 may transmit the write command to the memory controller 100. The write command may be a command which stores data in the security cell array 400.

Referring again to FIG. 9, the invalid data clean command may be transmitted to the invalidation bit circuit (S121).

Specifically, referring to FIG. 1, the memory controller 100 may transmit the invalid data clean command to the invalidation bit circuit 200. The invalid data clean command may be a command to update the invalid bit data 210 to the second state. The second state may be different from the first state.

Referring again to FIG. 9, the invalid bit data may be updated (S130).

Specifically, referring to FIG. 1, the invalid bit data 210 corresponding to the data (DATA) serving as the target of the write command is updated to the second state, and the second state may be expressed as a single bit of "0". However, the methods for controlling the memory devices according to some embodiments of the present inventive concepts may be expressed as "1" instead of "0". As long as the first state is expressed differently from the second state, its expression method is not limited at all.

The operations of S111 and S121 of FIG. 9 are performed by the memory controller 100 of FIG. 1, and the step of S130 may be performed by the invalidation bit circuit 200 of FIG. 1.

The update sequence (S100) of FIG. 7 may mean that the operations of FIGS. 8 and 9 are executed irrespective of the order and the number of times.

Referring to FIG. 10, the detailed operations of the read sequence (S200) of FIG. 7 may be described.

First, a read command may be received from the host (S210).

Specifically, referring to FIG. 1, the host 10 may transmit the read command to the memory controller 100. The read command may be a command which transmits data in the cell array 400 to the outside.

Referring again to FIG. 10, the read control command may be transmitted to the invalidation bit circuit (S220).

Specifically, referring to FIG. 1, the memory controller 100 may transmit the read control command to the invalidation bit circuit 200. The read control command may be a command for determining blockage or permission of the read operation.

Referring again to FIG. 10, the invalid bit data may be checked (S230).

Specifically, referring to FIG. 1, it may be possible to check whether the invalid bit data 210 corresponding to the data (DATA) intended to be read by the host 10 is in either the first state or the second state.

Referring again to FIG. 10, if the invalid bit data is in the second state (CLEAN), the read operation may be performed (S240).

Specifically, referring to FIG. 1, data (DATA) in the cell array 400 may be moved to the page buffer 600.

Subsequently, according to the read signal from the memory controller 100, the data (DATA) may be transmitted to the data I/O circuit 500. In accordance with the column address signal (CADDR) of the memory controller 100, the data I/O circuit 500 may transmit the data (DATA) to the host 10.

That is, one invalidation bit circuit 200 may not block the read operation.

Referring again to FIG. 10, if the invalid bit data is in the first state (SET), the invalid signal is output (S250).

Specifically, referring to FIG. 1, the invalidation bit circuit 200 may transmit the invalid signal (INVALID SIGNAL) to the data I/O circuit 500. That is, it may mean that the read operation is substantially blocked by making a replay of non-data to the read request from the host 10. At the same time, the data (DATA) in the cell array 400 may not be transmitted to the page buffer 600.

The methods for controlling the memory devices according to the present embodiment may improve security, by preventing accesses of old data at the level of the memory controller 100 even without a command such as a trim command at the level of the host 10.

Furthermore, since the overhead operation such as a deletion operation of data after scanning for deleting the old data and an operation for separately collecting the valid data is not required at all, the performance and the speed of the memory device may be sustained.

In concluding the detailed description, those skilled in the art will appreciate that many variations and modifications can be made to the preferred embodiments without substantially departing from the principles of the present inventive concepts. Therefore, the disclosed preferred embodiments of the invention are used in a generic and descriptive sense only and not for purposes of limitation.

While the present inventive concepts have been particularly shown and described with reference to exemplary embodiments thereof, it will be understood by those of ordinary skill in the art that various changes in form and details may be made therein without departing from the scope of the present inventive concepts as defined by the following claims. It is therefore desired that the present embodiments be considered in all respects as illustrative and not restrictive, reference being made to the appended claims rather than the foregoing description to indicate the scope of the present application.

What is claimed is:

1. A memory device comprising:
an address decoder;
an invalidation bit circuit connected to the address decoder via a first word line and a first string selection line; and
a cell array connected to the invalidation bit circuit via a second word line and a second string selection line,
wherein the invalidation bit circuit is configured to receive an invalid control command from a memory controller via a connection separate from the first word line and the first string selection line, and to update invalid bit data that is stored separately from the cell array to one of first and second states that are different from each other,
wherein in response to a read control command from the memory controller, the invalidation bit circuit is configured to provide an invalid signal when the invalid bit data is in the first state and transmit a data request to the cell array when the invalid bit data is in the second state, and
wherein the cell array is configured to receive the data request and provide data.

2. The memory device of claim 1, further comprising:
the memory controller, wherein the memory controller is configured to receive a read command, a write command or a secure file erase command from a host, and configured to transmit a control command including the read control command or the invalid control command to the invalidation bit circuit.

3. The memory device of claim 2, wherein the memory controller is configured to transmit the read control command to the invalidation bit circuit in response to receiving the read command, and
the memory controller is configured to transmit the invalid control command to the invalidation bit circuit in response to receiving the write command or the secure file erase command.

4. The memory device of claim 3, wherein the invalid control command comprises an invalid data set command causing the invalid bit data to be updated to the first state, or an invalid data clean command causing the invalid bit data to be updated to the second state, and
wherein the memory controller is configured to transmit the invalid data set command in response to receiving the secure file erase command, and is configured to transmit the invalid data clean command in response to receiving the write command.

5. The memory device of claim 1, wherein the invalid bit data is located inside the invalidation bit circuit.

6. The memory device of claim 1, wherein the cell array and the invalidation bit circuit share a plurality of word lines with each other.

7. The memory device of claim 6, wherein
the address decoder is configured to receive an address signal from the memory controller and is configured to provide a voltage to at least a part of the plurality of word lines.

8. The memory device of claim 7, wherein the cell array is a vertical NAND type flash memory.

9. A memory device comprising:
a memory controller configured to receive a first command and address signal from a host;
an address decoder configured to receive a second address signal from the memory controller;
a first word line and a first string selection line connected to the address decoder;
an invalidation bit circuit connected to the address decoder via the first word line and the first string selection line, wherein the invalidation bit circuit is separately connected to the memory controller, wherein the invalidation bit circuit is configured to receive a control command from the memory controller and further configured to update an invalid data bit in accordance with the control command and block a read operation of data in accordance with the invalid data bit; and
a cell array connected to invalidation bit circuit via a second word line and a second string selection line, and configured to store the data.

10. The memory device of claim 9, further comprising:
a ground selection line connected to the address decoder, the invalidation bit circuit and the cell array.

11. The memory device of claim 9, further comprising:
a data I/O circuit configured to receive the data from the cell array when the invalidation bit circuit permits the read operation of the data.

12. The memory device of claim 11, wherein the invalidation bit circuit provides an invalid signal to the data I/O circuit in response to the invalidation bit circuit blocking the read operation of the data.

13. The memory device of claim 11, further comprising:
a page buffer which receives the data from the cell array, and temporarily stores the data until the memory controller gives a read signal.

14. A memory device comprising:
a processing core;
a volatile memory;
a memory module; and
a bus which connects the processing core, the volatile memory, the memory module, and a host,
wherein the memory module includes:
an address decoder;
a memory controller configured to receive a command from the host;
a cell array configured to store data; and
an invalidation bit circuit connected to the address decoder via a first word line and a first string selection line, and connected to the cell array via a second word line and a second string selection line, wherein the invalidation bit circuit is configured to receive a control command from the memory controller, to update an invalid data bit that is stored separately from the cell array in accordance with the control command, and to block the command of the host in accordance with the invalid data bit.

15. The memory device of claim 14, wherein the invalidation bit circuit updates the invalid data bit to one of first and second states different from each other.

16. The memory device of claim 15, wherein, when the received command from the host is a secure file erase command, the memory controller is configured to transmit an invalid data set command to the invalidation bit circuit that causes the invalid data bit to be updated to the first state,
when the received command from the host is a read command, the memory controller is configured to transmit a read control command to the invalidation bit circuit, and
when receiving the read control command, the invalidation bit circuit blocks a read operation of the host.

17. The memory device of claim 15, wherein the cell array and the invalidation bit circuit share a plurality of word lines with each other.

18. The memory device of claim 17
wherein the address decoder is configured to receive an address signal from the memory controller and is configured to provide a voltage to at least a part of the plurality of word lines.

* * * * *